(12) United States Patent
Nomura et al.

(10) Patent No.: US 7,088,755 B2
(45) Date of Patent: Aug. 8, 2006

(54) NITRIDE-BASE SEMICONDUCTOR LASER DEVICE

(75) Inventors: Yasuhiko Nomura, Moriguchi (JP); Daijiro Inoue, Kyoto (JP); Masayuki Hata, Kadoma (JP); Takashi Kano, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 288 days.

(21) Appl. No.: 10/663,707

(22) Filed: Sep. 17, 2003

(65) Prior Publication Data

US 2004/0057487 A1 Mar. 25, 2004

(30) Foreign Application Priority Data

Sep. 20, 2002 (JP) .............................. 2002-275763

(51) Int. Cl.
*H01S 5/00* (2006.01)
*H01S 5/20* (2006.01)

(52) U.S. Cl. .............................. 372/45.01; 372/46.015; 372/44.01

(58) Field of Classification Search ............. 372/45.01, 372/44.01, 46.015
See application file for complete search history.

(56) References Cited

U.S. PATENT DOCUMENTS

| 6,441,393 B1 * | 8/2002 | Goetz et al. .................. 257/13 |
| 2002/0008242 A1 * | 1/2002 | Hata ........................... 257/79 |
| 2002/0189532 A1 * | 12/2002 | Motoki et al. ................ 117/99 |
| 2005/0089073 A1 * | 4/2005 | Behringer et al. ............ 372/50 |

FOREIGN PATENT DOCUMENTS

| JP | 10-294529 | 11/1998 |
| JP | 11-340580 | 12/1999 |
| JP | 2001-57461 | 2/2001 |
| JP | 2002-124737 | 4/2002 |
| JP | 2002-299768 | 10/2002 |

OTHER PUBLICATIONS

Nishinaga Tatau, "Hetero-epitaxy with Large Lattice Mismatch and Microchannel Epitaxy of Compound Semiconductor." Department of Electronic Engineering, Graduate School of Engineering, vol. 21, No. 6, pp. 320-325, 2000.
H. Amano, et al. "Metalorganic vapor phase epitaxial growth of a high quality GaN film using an AlN buffer layer." Appl. Phys. Lett., vol. 48, No. 5, Feb. 3, 1986, pp. 353-355.

* cited by examiner

*Primary Examiner*—Minsun Harvey
*Assistant Examiner*—Marcia A. Golub
(74) *Attorney, Agent, or Firm*—McDermott Will & Emery LLP

(57) ABSTRACT

A nitride-based semiconductor laser device capable of attaining stabilization of a laser beam and inhibiting a threshold current and an operating current from increase is provided. This nitride-based semiconductor laser device comprises a substrate consisting of either a nitride-based semiconductor doped with an impurity or a boride-based material, an n-type cladding layer formed on the substrate, an active layer consisting of a nitride-based semiconductor formed on the n-type cladding layer, a p-type cladding layer formed on the active layer and a light guide layer formed only between the active layer and the p-type cladding layer in the interspaces between the active layer and the n- and p-type cladding layers.

11 Claims, 10 Drawing Sheets

NITRIDE-BASE SEMICONDUCTOR LASER DEVICE

BACKGROUND OF THE INVENTION

1. Field of the Invention

The present invention relates to a nitride-based semiconductor laser device, and more particularly, it relates to a nitride-based semiconductor laser device having nitride-based semiconductor layers formed on a substrate.

2. Description of the Background Art

A nitride-based semiconductor laser device has recently been expected for application to a light source for an advanced large capacity optical disk, and actively developed. A method of growing nitride-based semiconductor layers on a sapphire substrate thereby forming a nitride-based semiconductor laser device is known in general. In relation to this, known is a technique of forming a low-temperature buffer layer between the sapphire substrate and the nitride-based semiconductor layers in order to relax lattice mismatching between the sapphire substrate and the nitride-based semiconductor layers. This technique is disclosed in H. Amano et al., Appl. Phys. Lett. 48,353 (1986), for example. Also generally known is a technique of providing a light guide layer between an active layer and a cladding layer thereby reinforcing confinement of vertical light. This is disclosed in Japanese Patent Laying-Open No. 10-294529 (1998), for example.

FIG. 18 is a sectional view showing an exemplary conventional nitride-based semiconductor laser device, and FIG. 19 is a detailed sectional view of an emission layer of the conventional nitride-based semiconductor laser device shown in FIG. 18. The structure of this conventional nitride-based semiconductor laser device is now described with reference to FIGS. 18 and 19.

In this conventional nitride-based semiconductor laser device, a low-temperature buffer layer 102 of undoped GaN having a thickness of about 20 nm is formed on a sapphire substrate 101, as shown in FIG. 18. An n-type contact layer 103 of n-type GaN doped with Si having a thickness of about 4 µm is formed on the low-temperature buffer layer 102. The n-type contact layer 103 is partially removed to have an exposed surface and a projecting portion. An n-type anti-cracking layer 104 of n-type $In_{0.1}Ga_{0.9}N$ doped with Si having a thickness of about 50 nm is formed on the projecting portion of the n-type contact layer 103. An n-type cladding layer 105 of n-type $Al_{0.3}Ga_{0.7}N$ doped with Si having a thickness of about 0.5 µm is formed on the n-type anti-cracking layer 104. An emission layer 106 is formed on the n-type cladding layer 105.

As shown in FIG. 19, the emission layer 106 is constituted of an n-type light guide layer 161, an MQW (multiple quantum well) active layer 162 formed on the n-type light guide layer 161, a p-type cap layer 163 formed on the MQW active layer 162 and a p-type light guide layer 164 formed on the p-type cap layer 163. The n-type light guide layer 161 consists of n-type GaN doped with Si and has a thickness of about 100 nm. The MQW active layer 162 is formed by alternately stacking four barrier layers 162a of undoped $In_{0.01}Ga_{0.99}N$ each having a thickness of about 20 nm and three well layers 162b of $In_{0.2}Ga_{0.8}N$ doped with Si each having a thickness of about 2.5 nm. The p-type cap layer 163 consists of p-type $Al_{0.2}Ga_{0.8}N$ doped with Mg and has a thickness of about 10 nm. This p-type cap layer 163 has a function of preventing the MQW active layer 162 from deterioration of crystals by preventing desorption of In contained in the MQW active layer 162. The p-type light guide layer 164 consists of p-type GaN doped with Mg and has a thickness of about 100 nm.

As shown in FIG. 18, a p-type cladding layer 107 of p-type $Al_{0.3}Ga_{0.7}N$ doped with Mg having a thickness of about 0.5 µm is formed on the emission layer 106 (the p-type light guide layer 164). The p-type cladding layer 107 is partially removed to have a projecting portion. A p-type contact layer 108 of p-type GaN doped with Mg having a thickness of about 0.5 µm is formed on the projecting portion of the p-type cladding layer 107. The p-type contact layer 108 and the projecting portion of the p-type cladding layer 107 constitute a ridge potion 109.

A current blocking layer 110 of $SiO_2$ having a thickness of about 0.2 µm is formed on a partial region of the exposed surface of the n-type contact layer 103, the side surfaces of the n-type anti-cracking layer 104, the n-type cladding layer 105, the emission layer 106 and the p-type contact layer 108 and the surface of the p-type cladding layer 107. A p-side ohmic electrode 111 is formed on the p-type contact layer 108. A p-side pad electrode 112 is formed to cover the surface of the p-side ohmic electrode 111 and a partial region of the surface of the current blocking layer 110. An n-side ohmic electrode 113 is formed on another partial region of the exposed surface of the n-type contact layer 103. An n-side pad electrode 114 is formed on the upper surface of the n-side ohmic electrode 113.

In the conventional nitride-based semiconductor laser device shown in FIG. 18, a voltage is forwardly applied between the p-side pad electrode 112 and the n-side pad electrode 114 so that a current flows from the p-side pad electrode 112 to the n-side pad electrode 114 through the p-side ohmic electrode 111, the nitride-based semiconductor layers 108 to 103 and the n-side ohmic electrode 113. Thus, the emission layer 106 generates a laser beam. In this case, light in the emission layer 106 is vertically confined due to difference between the refractive indices of the MQW active layer 162 and the n- and p-type cladding layers 105 and 107.

The n- and p-type light guide layers 161 and 164 having intermediate refractive indices between those of the MQW active layer 162 and the n- and p-type cladding layers 105 and 107 are provided between the MQW active layer 162 and the n- and p-type cladding layers 105 and 107 respectively so that confinement of the vertical light can be reinforced, whereby high-density light can be confined in the emission layer 106.

In another exemplary conventional nitride-based semiconductor laser device, nitride-based semiconductor layers are formed on a substrate of n-type SiC, as disclosed in Japanese Patent Laying-Open No. 11-340580 (1999), for example. In still another exemplary conventional nitride-based semiconductor laser device, nitride-based semiconductor layers are formed on a substrate of GaAs or Si.

In the conventional nitride-based semiconductor laser device shown in FIG. 18, however, AlGaN employed for the n- and p-type cladding layers 105 and 107 or InGaN employed for the MQW active layer 162 has such an inconvenience that crystal quality is remarkably deteriorated if the Al composition or the In composition is increased. Thus, it is difficult to increase the difference between the refractive indices of the MQW active layer 162 and the n- and p-type cladding layers 105 and 107 by increasing the Al composition or the In composition. Also when the n- and p-type light guide layers 161 and 164 are provided between the MQW active layer 162 and the n- and p-type cladding layers 105 and 107, therefore, optical confinement is inconveniently insufficient.

As hereinabove described, optical confinement is so insufficient in the conventional nitride-based semiconductor laser device that light tends to effuse from the emission layer 106 including the MQW active layer 162 toward the n- and p-type cladding layers 105 and 107. In general, it is conceivable that light effusing from the emission layer 106 partially propagates to the transparent sapphire substrate 1 to exert bad influence on the laser beam. More specifically, spatial distribution of light intensity is not excellently single mode but the laser beam itself is so destabilized that the shape or a spot position thereof varies during driving of the laser device. Consequently, it is difficult to stabilize the laser beam.

Further, a larger number of dislocations are formed in the low-temperature buffer layer 102 provided for relaxing lattice mismatching between the sapphire substrate 101 and the n-type contact layer 103 itself, to inconveniently result in light scattering or absorption in the low-temperature buffer layer 102. This also leads to difficulty in stabilization of the laser beam.

In the conventional nitride-based semiconductor laser device shown in FIG. 18, a p-type nitride-based semiconductor layer containing Al doped with Mg and Zn serving as a p-type dopant is remarkably deteriorated in crystal quality when increased in thickness, due to formation of cracks or the like. Therefore, the thickness of the p-type cladding layer 107 consisting of p-type AlGaN must be suppressed to several 100 nm, and hence it is difficult to increase the distance between the emission layer 106 and the p-side ohmic electrode 111. Thus, the distance between the emission layer 106 and the p-side ohmic electrode 111 is so small in the conventional nitride-based semiconductor laser device that the p-side ohmic electrode 111 inconveniently absorbs intense light around the emission layer 106. In this case, the emission wavelength of the nitride-based semiconductor laser beam is so smaller than that of an infrared or red semiconductor laser beam that the p-side ohmic electrode 111 inconveniently easily absorbs the nitride-based semiconductor laser beam. Consequently, a threshold current or an operating current is disadvantageously increased.

In a further conventional nitride-based semiconductor laser device employing a substrate of GaAs or Si, the substrate of GaAs or Si having a band gap sufficiently smaller than the band gap of an active layer (the quantum level of a well layer when the active layer has an MQW structure) can absorb light effusing from an emission layer dissimilarly to a sapphire substrate. However, the band gap of GaAs or Si is so small as compared with that of the emission wavelength that the substrate of GaAs or Si inconveniently excessively absorbs light. Consequently, the threshold current or the operating current is disadvantageously increased.

In the aforementioned conventional nitride-based semiconductor laser device employing a substrate of SiC disclosed in Japanese Patent Laying-Open No. 11-340580, it is difficult for the substrate of SiC, i.e., an indirect transition semiconductor hardly absorbing light, to effectively absorb light effusing from the emission layer due to a band gap equivalent to that of the active layer consisting of a nitride-based semiconductor. Consequently, the laser beam is disadvantageously destabilized.

A p-type nitride-based semiconductor doped with Mg or Zn has an impurity level deeper than that of an n-type nitride-based semiconductor doped with an n-type dopant, and hence a p-type nitride-based semiconductor layer remarkably absorbs light. When p-type nitride-based semiconductor layers are formed on a substrate, therefore, it is disadvantageously difficult for light effusing from the emission layer to efficiently effuse into the substrate.

SUMMARY OF THE INVENTION

An object of the present invention is to provide a nitride-based semiconductor laser device capable of stabilizing a laser beam and inhibiting a threshold current or an operating current from increase.

In order to attain the aforementioned object, a nitride-based semiconductor laser device according to an aspect of the present invention comprises a substrate consisting of either a nitride-based semiconductor doped with an impurity or a boride-based material, an n-type cladding layer formed on the substrate, an active layer consisting of a nitride-based semiconductor formed on the n-type cladding layer, a p-type cladding layer formed on the active layer and a light guide layer formed only between the active layer and the p-type cladding layer in the interspaces between the active layer and the n-type and p-type cladding layers.

In the nitride-based semiconductor laser device according to this aspect, as hereinabove described, the light guide layer is provided only between the active layer and the p-type cladding layer in the interspaces between the active layer and the n- and p-type cladding layers so that no n-side light guide layer is present, whereby light generated in the active layer can preferentially effuse toward the substrate. Thus, an impurity level of the substrate consisting of the nitride-based semiconductor doped with the impurity can absorb the light effusing toward the substrate, thereby stabilizing a laser beam. If the substrate consists of a boride-based material, light effusing toward the substrate can be absorbed by intraband transition (transition in a valence band or a conduction band) or interband transition (transition from the valence band to the conduction band), whereby the laser beam can be stabilized.

The light generated in the active layer can so preferentially effuse toward the substrate that a p-side electrode opposite to the substrate can be inhibited from optical absorption. Thus, the threshold current or the operating current can be inhibited from increase. Further, the substrate consisting of a nitride-based semiconductor or a boride-based material causes no excessive optical absorption dissimilarly to a substrate consisting of GaAs or Si, whereby the threshold current or the operating current can be inhibited from increase. The n-type cladding layer having a shallower impurity level than the p-type cladding layer is provided on the side of the substrate to be inhibited from absorbing light effusing toward the substrate, whereby the light can efficiently effuse toward the substrate.

The nitride-based semiconductor laser device is provided with no n-side light guide layer, whereby the band gap does not vary stepwise between the n-type cladding layer and the active layer. Therefore, holes injected into the active layer hardly exceed the band gap difference between the n-type cladding layer and the active layer, and can be inhibited from overflowing into the n-type cladding layer. Thus, the threshold current can be inhibited from increase also when the temperature is increased. Consequently, the temperature characteristic of the device can be improved. The aforementioned overflowing of the holes into the n-type cladding layer is now described in more detail. When an n-side light guide layer is provided, the band gaps vary stepwise (in two stages) in order of the active layer, the n-side light guide layer and the n-type cladding layer. Thus, there is a possibility that holes injected into the active layer overflow from the active layer into the n-type cladding layer through the n-side light guide layer having the band gap between those of the active layer and the n-type cladding layer. If no n-side light guide layer is provided, holes overflow only when exceeding the band gap difference between the active layer and the n-type cladding layer. In this case, the band gap difference between the active layer and the n-type cladding layer is larger than that between the active layer and the n-side light guide layer, and can be inhibited from overflowing from the active layer into the n-type cladding layer.

In the nitride-based semiconductor laser device according to the aforementioned aspect, the substrate preferably absorbs part of light generated in the active layer. According to this structure, the impurity level of the substrate consisting of the nitride-based semiconductor doped with the impurity can easily absorb light effusing toward the substrate. In this case, the impurity doped into the substrate is preferably oxygen. According to this structure, the impurity level can be effectively formed in the substrate with oxygen, thereby effectively absorbing light effusing toward the substrate. Thus, the laser beam is not destabilized also when the active layer insufficiently confines light due to the absence of the n-side light guide layer. In this case, the laser beam can be further stabilized by the substrate partially absorbing light generated in the active layer. When the substrate consists of a boride-based material, the light effusing toward the substrate can be easily absorbed by intraband transition (transition in the valence band or the conduction band) or interband transition (transition from the valence band to the conduction band).

In the nitride-based semiconductor laser device according to the aforementioned aspect, the n-type cladding layer is preferably undoped. In the present invention, the term "undoped" denotes a state not intentionally doped with an impurity. Therefore, not only a state doped with absolutely no impurity but also a state unintentionally doped with a small quantity of impurity corresponds to the term "undoped" in the present invention. According to this structure, the active layer formed on the n-type cladding layer can be improved in crystal quality, whereby luminous efficiency can be improved. Further, the n-type cladding layer formed with no impurity level can be inhibited from optical absorption.

In the nitride-based semiconductor laser device according to the aforementioned aspect, the n-type cladding layer is preferably doped with Ge. According to this structure, Ge having a lattice constant close to that of the nitride-based semiconductor can effectively suppress distortion resulting from doping. Thus, the active layer formed on the n-type cladding layer can be improved in crystal quality, whereby the luminous efficiency can be improved. Further, resistance of the n-type cladding layer can be easily controlled by an amount of Ge in doping.

The nitride-based semiconductor laser device according to the aforementioned aspect preferably further comprises a layer, formed between the substrate and the n-type cladding layer, consisting of an undoped nitride-based semiconductor. According to this structure, the n-type cladding layer formed on this layer can be improved in crystal quality, to be inhibited from optical absorption. The layer consisting of the undoped nitride-based semiconductor layer is so provided that the distance between the active layer and the substrate can be adjusted, whereby the quantity of optical absorption in the substrate can be easily controlled.

The nitride-based semiconductor laser device according to the aforementioned aspect preferably further comprises a layer, formed between the substrate and the n-type cladding layer, consisting of a nitride-based semiconductor doped with Ge. According to this structure, Ge having a lattice constant close to that of the nitride-based based semiconductor can effectively suppress distortion resulting from doping. Thus, the n-type cladding layer formed on the layer consisting of the nitride-based semiconductor doped with Ge can be improved in crystal quality, to be inhibited from optical absorption. Further, resistance of the layer consisting of the nitride-based semiconductor doped with Ge can be easily controlled by controlling the dose of Ge.

In the nitride-based semiconductor laser device according to the aforementioned aspect, the substrate preferably includes either a GaN substrate or a $ZrB_2$ substrate. According to this structure, GaN or $ZrB_2$ having a lattice constant close to those of the nitride-based semiconductors constituting the n-type cladding layer and the active layer formed thereon can improve the n-type cladding layer and the active layer in crystal quality. Thus, the n-type cladding layer can be inhibited from optical absorption, whereby the laser beam can be stabilized. Further, a GaN substrate or a $ZrB_2$ substrate causes no excessive optical absorption dissimilarly to a substrate consisting of GaAs or Si, whereby the threshold current or the operating current can be inhibited from increase.

In the nitride-based semiconductor laser device according to the aforementioned aspect, the p-type cladding layer preferably includes a p-type cladding layer consisting of a nitride-based semiconductor having a lattice constant smaller than the lattice constant of GaN, and the light guide layer is preferably constituted of a nitride-based semiconductor having a lattice constant larger than the lattice constant of GaN. According to this structure, the light guide layer can compensate for lattice distortion caused in the p-type cladding layer of the nitride-based semiconductor having the lattice constant smaller than that of GaN. Thus, the p-type cladding layer can be improved in crystal quality. Further, a nitride-based semiconductor layer formed on the p-type cladding layer can also be improved in crystal quality. Consequently, the p-type cladding layer and the nitride-based semiconductor layer formed thereon are inhibited from optical absorption, whereby the light generated in the active layer can preferentially effuse toward the substrate.

In this case, the light guide layer preferably consists of InGaN. According to this structure, the lattice constant of the light guide layer can easily exceed that of GaN.

In the nitride-based semiconductor laser device according to the aforementioned aspect, the light guide layer is preferably undoped. According to this structure, the light guide layer is formed with no impurity level. Thus, the light guide layer can be inhibited from optical absorption resulting from an impurity level, whereby the light generated in the active layer can preferably effuse toward the substrate.

The nitride-based semiconductor laser device according to the aforementioned aspect preferably further comprises an n-type carrier blocking layer, formed between the n-type cladding layer and the active layer, consisting of a nitride-based semiconductor having a refractive index smaller than the refractive index of the n-type cladding layer. According to this structure, light to be confined in the n-type cladding layer having a larger refractive index than the n-type carrier blocking layer can easily effuse into the n-type cladding layer. Thus, the light generated in the active layer can further preferentially effuse toward the substrate.

In this case, the n-type cladding layer preferably includes an n-type cladding layer consisting of AlGaN having a first Al composition ratio, and the n-type carrier blocking layer preferably includes an n-type carrier blocking layer consisting of AlGaN having a second Al composition ratio larger than the first Al composition ratio. According to this structure, the refractive index of the n-type carrier blocking layer can easily exceed that of the n-type cladding layer.

The nitride-based semiconductor laser device according to the aforementioned aspect preferably further comprises an n-type carrier blocking layer, formed between the n-type cladding layer and the active layer, consisting of a nitride-based semiconductor having a band gap larger than the band gap of the n-type cladding layer and the band gap of the active layer. According to this structure, holes can be further inhibited from overflowing into the n-type cladding layer due to the band gap difference between the n-type carrier blocking layer and the active layer larger than that between the n-type cladding layer and the active layer.

In this case, the n-type cladding layer preferably includes an n-type cladding layer consisting of AlGaN having a first Al composition ratio while the active layer preferably includes an active layer consisting of InGaN, and the n-type carrier blocking layer preferably includes an n-type carrier blocking layer consisting of AlGaN having a second Al composition ratio larger than the first Al composition ratio. According to this structure, the band gap of the n-type carrier blocking layer can easily exceed those of the n-type cladding layer and the active layer.

The nitride-based semiconductor laser device according to the aforementioned aspect preferably further comprises an impurity introduction layer formed by introducing an impurity into a region other than the p-type cladding layer and a current path part of a nitride-based semiconductor layer formed on the p-type cladding layer. According to this structure, the impurity introduction layer including a larger number of crystal defects than the remaining region exhibits high resistance. Thus, the impurity introduction layer functions as a current narrowing layer while functioning also as an optical absorption layer due to optical absorption resulting from the crystal defects. Consequently, the nitride-based semiconductor laser device can transversely confine light thereby stabilizing the transverse mode of the laser beam.

In this case, the impurity introduction layer is preferably an ion implantation layer. According to this structure, the ion implantation layer serving as the impurity introduction layer can be easily formed on the region other than the p-type cladding layer and the current path part of the nitride-based semiconductor layer formed on the p-type cladding layer.

In this case, the impurity preferably includes carbon, and the maximum value of the impurity concentration of carbon in the impurity introduction layer is preferably at least about $5 \times 10^{19}$ cm$^{-3}$. According to this structure, the impurity introduction layer can easily perform not only current narrowing but also transverse confinement of light.

The nitride-based semiconductor laser device according to the aforementioned aspect preferably further comprises an undoped p-side contact layer formed on the p-type cladding layer. According to this structure, the undoped p-side contact layer, formed with no impurity level dissimilarly to a p-type contact layer doped with a p-type dopant such as Mg, can be inhibited from optical absorption resulting from an impurity level.

In this case, the active layer preferably includes an active layer of a quantum well structure consisting of a nitride-based semiconductor containing In, and the undoped p-side contact layer preferably has a thickness smaller than the thickness of a quantum well layer of the active layer and an In composition ratio smaller than the In composition ratio of the quantum well layer. According to this structure, the undoped p-side contact layer having a band gap larger than the band gap of the active layer (the quantum level in the quantum well layer) can be inhibited from optical absorption. Thus, the threshold current or the operating current can be inhibited from increase resulting from optical absorption in the p-side contact layer.

In this case, the thickness of the undoped p-side contact layer is preferably at least about 3 nm and not more than 5 nm. According to this structure, the threshold current or the operating current can be easily inhibited from increase.

In this case, the In composition ratio of the undoped p-side contact layer is preferably at least about 0.05 and smaller by at least about 0.05 than the In composition ratio of the quantum well layer of the active layer. According to this structure, the threshold current or the operating current can be easily inhibited from increase.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a nitride-based semiconductor laser device according to a first embodiment of the present invention is described with reference to FIGS. 1 and 2.

Figure 1:
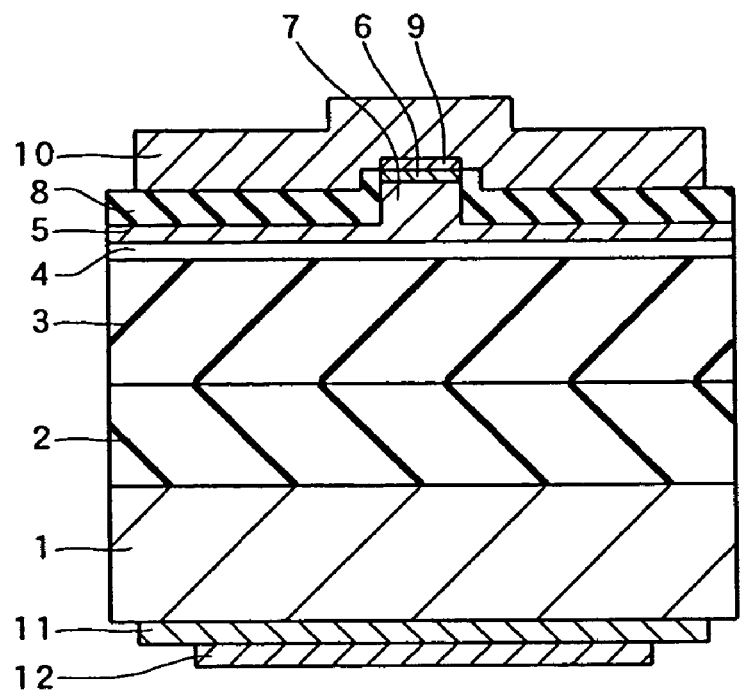
FIG. 1 is a sectional view showing the structure of a nitride-based semiconductor laser device according to a first embodiment of the present invention.

In the nitride-based semiconductor laser device according to the first embodiment, an undoped GaN layer 2 having a thickness of about 1 µm is formed on the (0001) plane of an n-type GaN substrate 1 doped with oxygen, as shown in FIG. 1. The n-type GaN substrate 1 is an example of the "substrate consisting of a nitride-based semiconductor" in the present invention, and the undoped GaN layer 2 is an example of the "layer consisting of an undoped nitride-based semiconductor" in the present invention. An undoped n-type cladding layer 3 of undoped $Al_{0.07}Ga_{0.93}N$ having a thickness of about 1 µm is formed on the undoped GaN layer 2. An emission layer 4 is formed on the undoped n-type cladding layer 3.

Figure 2:
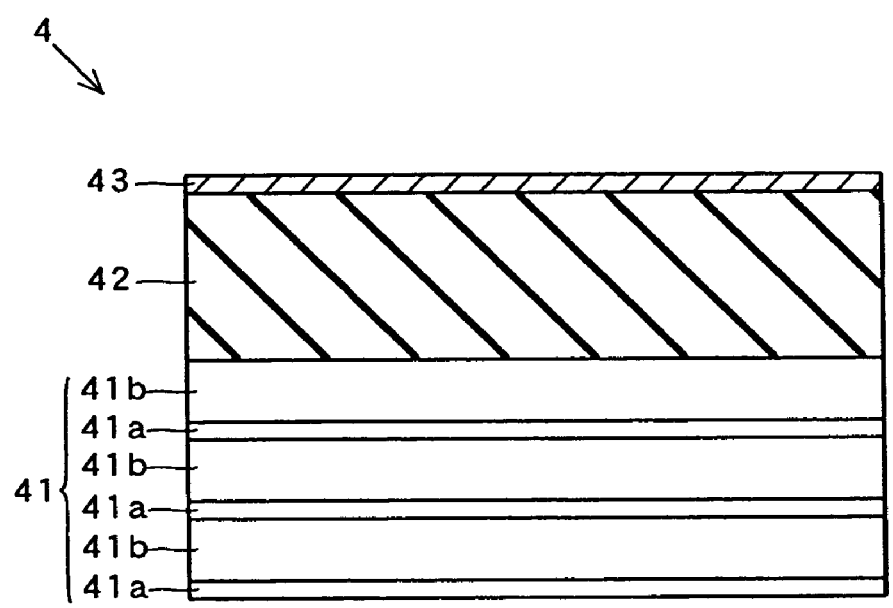
FIG. 2 is a detailed sectional view of an emission layer of the nitride-based semiconductor laser device according to the first embodiment shown in FIG. 1.

According to the first embodiment, the emission layer 4 is provided therein with no n-side light guide layer, as shown in FIG. 2. In other words, the emission layer 4 is constituted of an MQW active layer 41 having a multiple quantum well structure, a p-side light guide layer 42 formed on the MQW active layer 41 and a p-type carrier blocking layer 43 formed on the p-side light guide layer 42. The MQW active layer 41 is an example of the "active layer" in the present invention, and the p-side light guide layer 42 is an example of the "light guide layer" in the present invention.

The MQW active layer 41 is formed by alternately stacking three quantum well layers 41a of undoped $In_xGa_{1-x}N$ each having a thickness of about 3.5 nm and three quantum barrier layers 41b of undoped $In_YGa_{1-Y}N$ each having a thickness of about 20 nm, where X>Y, X=0.15 and Y=0.05. The p-side light guide layer 42 consists of undoped $In_{0.01}Ga_{0.99}N$ and has a thickness of about 0.1 µm. The p-type carrier blocking layer 43 consists of p-type $Al_{0.25}Ga_{0.75}N$ layer doped with Mg and has a thickness of about 20 nm. The emission layer 4 has an optical confinement factor, indicating the ratio of light energy confined in the p-side light guide layer 42, of about 0.35.

As shown in FIG. 1, a p-type cladding layer 5 of $Al_{0.07}Ga_{0.93}N$ doped with Mg is formed on the emission layer 4 (the p-type carrier blocking layer 43). This p-type cladding layer 5 is partially removed to have a projecting portion. The thickness of the projecting portion of the p-type cladding layer 5 is about 0.35 µm, and that of the remaining region is about 0.05 µm. The width of the projecting portion of the p-type cladding layer 5 is about 1.5 µm. A p-type contact layer 6 of p-type $In_{0.01}Ga_{0.99}N$ doped with Mg having a thickness of about 3 nm is formed on the projecting portion of the p-type cladding layer 5. The projecting portion of the p-type cladding layer 5 and the p-type contact layer 6 constitute a ridge portion 7 serving as a current path. A current blocking layer 8 consisting of an $SiO_2$ film having a thickness of about 0.2 µm is formed on the side surfaces of the ridge portion 7 and the exposed surface of the p-type cladding layer 5.

A p-side ohmic electrode 9 consisting of a Pt layer having a thickness of about 1 nm, a Pd layer having a thickness of about 100 nm, an Au layer having a thickness of about 240 nm and an Ni layer having a thickness of about 240 nm in ascending order is formed on the p-type contact layer 6 constituting the ridge portion 7 in a striped (elongated) manner. A p-side pad electrode 10 consisting of a Ti layer having a thickness of about 100 nm, a Pt layer having a thickness of about 150 nm and an Au layer having a thickness of about 3 µm in ascending order is formed on the surface of the p-side ohmic electrode 9 and a partial region of the surface of the current blocking layer 8 to be in contact with the upper surface of the p-side ohmic electrode 9.

An n-side ohmic electrode 11 consisting of an Al layer having a thickness of about 6 nm, an Si layer having a thickness of about 2 nm, an Ni layer having a thickness of about 10 nm and an Au layer having a thickness of about 100 nm from the side closer to the n-type GaN substrate 1 is formed on the rear surface of the n-type GaN substrate 1. An n-side pad electrode 12 consisting of an Ni layer having a thickness of about 10 nm and an Au layer having a thickness of about 700 nm from the side closer to the n-side ohmic electrode 11 is formed on the rear surface of the n-side ohmic electrode 11.

According to the first embodiment, as hereinabove described, the light guide layer (the p-side light guide layer 42) is provided only between the MQW active layer 41 and the p-type cladding layer 5 so that no n-side light guide layer is present, and hence the light generated in the MQW active layer 41 can preferentially effuse toward the n-type GaN substrate 1. Thus, the impurity level of the n-type GaN substrate 1 doped with oxygen can absorb the light effusing toward the n-type GaN substrate 1, whereby the nitride-based semiconductor laser device can stabilize the laser beam. Further, the light generated in the MQW active layer 41 can so preferentially effuse toward the n-type GaN substrate 1 that the p-side ohmic electrode 9 opposed to the n-type GaN substrate 1 can be inhibited from optical absorption. Thus, the threshold current or the operating current can be inhibited from increase. In addition, the n-type GaN substrate 1 causes no excess optical absorption dissimilarly to a substrate consisting of GaAs or Si, whereby the threshold current or the operating current can be inhibited from increase. Further, the band gaps do not vary stepwise between the undoped n-type cladding layer 3 and the MQW active layer 41 due to the absence of the n-type light guide layer. Thus, holes injected into the MQW active layer 41 hardly exceed the difference between the band gaps of the n-type cladding layer 3 and the MQW active layer 41, and can be inhibited from overflowing into the n-type cladding layer 3. Thus, the threshold current can be inhibited from increase also when the temperature is increased. Consequently, the nitride-based semiconductor laser device can be improved in temperature characteristic.

According to the first embodiment, as hereinabove described, the n-type GaN substrate 1 is so doped with oxygen that the impurity level of the n-type GaN substrate 1 doped with oxygen can easily absorb the light effusing toward the n-type GaN substrate 1. Further, the n-type GaN substrate 1 is so doped with oxygen that oxygen can effectively form the impurity level in the n-type GaN substrate 1 for effectively absorbing the light effusing toward the n-type GaN substrate 1. Thus, the laser beam is not destabilized even if the MQW active layer 41 insufficiently confines light due to the absence of the n-side light guide layer. In this case, the nitride-based semiconductor laser device can further stabilize the laser beam due to optical absorption by the n-type GaN substrate 1.

According to the first embodiment, as hereinabove described, the n-type cladding layer 3 is so undoped and formed on the undoped GaN layer 2 that the undoped n-type cladding layer 3 as well as the MQW active layer 41 formed thereon can be improved in crystal quality. Thus, the n-type cladding layer 3 can be inhibited from optical absorption while the MQW active layer 41 can be improved in luminous efficiency. In addition, the undoped n-type cladding layer 3 and the undoped GaN layer 2 are formed with no impurity levels, whereby the n-type cladding layer 3 can be inhibited from optical absorption. The undoped GaN layer 2 can also be inhibited from optical absorption. The distance between the emission layer 4 and the n-type GaN substrate 1 can be adjusted to a prescribed value (about 2 µm in the first embodiment) by controlling the thickness of the undoped GaN layer 2, whereby the quantity of optical absorption in the n-type GaN substrate 1 can be easily controlled.

Further, the lattice constant of GaN forming the n-type GaN substrate 1 and those of the nitride-based semiconductors constituting the undoped n-type cladding layer 3 and the MQW active layer 41 formed thereon are so close that the n-type cladding layer 3 and the MQW active layer 41 can be improved in crystal quality.

According to the first embodiment, the p-side light guide layer 42 consists of $In_{0.01}Ga_{0.99}N$ having a larger lattice constant than GaN, to be capable of compensating for lattice distortion caused in the p-type carrier blocking layer 43 consisting of p-type $Al_{0.25}Ga_{0.75}N$ having a smaller lattice constant than GaN and the p-type cladding layer 5 consisting of p-type $Al_{0.07}Ga_{0.93}N$. Thus, the p-type carrier blocking layer 43 and the p-type cladding layer 5 can be improved in crystal quality. Further, the p-type contact layer 6 formed on the p-type cladding layer 5 can also be improved in crystal quality. In addition, the p-side light guide layer 42 is so undoped that the same is formed with no impurity level. Consequently, the p-side light guide layer 42, the p-type carrier blocking layer 43, the p-type cladding layer 5 and the p-type contact layer 6 are inhibited from optical absorption, whereby the light generated in the MQW active layer 41 can preferentially effuse toward the n-type GaN substrate 1.

A process of fabricating the nitride-based semiconductor laser device according to the first embodiment is now described with reference to FIGS. 1 to 8.

Figure 3:
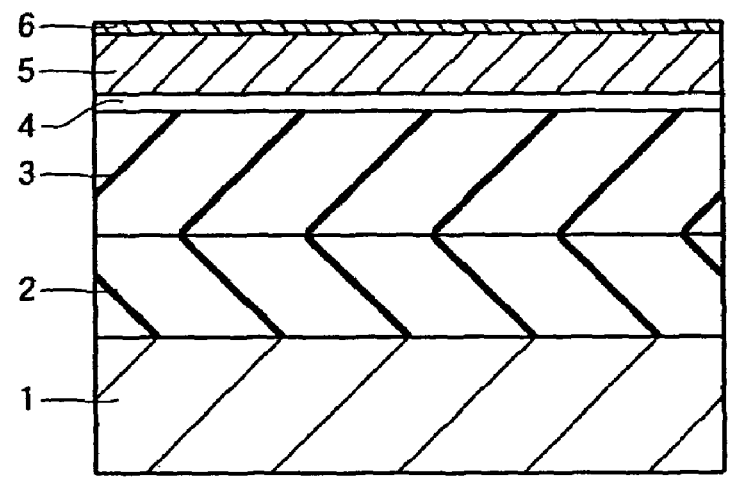
FIGS. 3 to 8 are sectional views for illustrating a process of fabricating the nitride-based semiconductor laser device according to the first embodiment shown in FIG. 1.

First, the undoped GaN layer 2, the n-type cladding layer 3, the emission layer 4, the p-type cladding layer 5 and the p-type contact layer 6 are successively formed on the n-type GaN substrate 1 by MOCVD (metal organic chemical vapor deposition), as shown in FIG. 3.

More specifically, the n-type GaN substrate 1 doped with oxygen is held at a growth temperature of about 1150° C. for forming the undoped GaN layer 2 having the thickness of about 1 μm on the (0001) plane of the n-type GaN substrate 1. Then, the n-type cladding layer 3 of undoped $Al_{0.07}Ga_{0.93}N$ having the thickness of about 1 μm is formed on the undoped GaN layer 2.

Then, the n-type GaN substrate 1 is held at a growth temperature of about 850° C. for alternately growing three quantum well layers 41a of undoped $In_xGa_{1-x}N$ each having the thickness of about 3.5 nm and the three quantum barrier layers 41b of undoped $In_yGa_{1-y}N$ each having the thickness of about 20 nm, as shown in FIG. 2. Thus, the MQW active layer 41 is formed on the n-type cladding layer 3. Then, the p-side light guide layer 42 of undoped $In_{0.01}Ga_{0.99}N$ having the thickness of about 0.1 μm is grown on the MQW active layer 41.

Then, the n-type GaN substrate 1 is held at a growth temperature of about 950° C. for growing the p-type carrier blocking layer 43 of p-type $Al_{0.25}Ga_{0.75}N$ doped with Mg having the thickness of about 20 nm on the p-side light guide layer 42.

Then, the n-type GaN substrate 1 is held at a growth temperature of about 1150° C. for growing the p-type cladding layer 5 of p-type $Al_{0.07}Ga_{0.93}N$ doped with Mg having the thickness of about 0.35 μm on the emission layer 4 (the p-type carrier blocking layer 43), as shown in FIG. 3. Then, the p-type contact layer 6 of p-type $In_{0.01}Ga_{0.99}N$ doped with Mg having the thickness of about 3 nm is grown on the p-type cladding layer 5.

Figure 4:
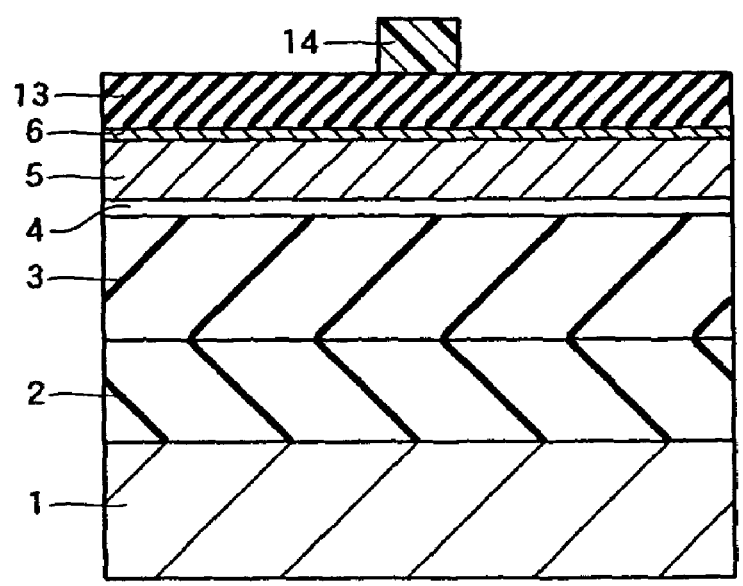

Then, an $SiO_2$ film 13 having a thickness of about 1 μm is formed substantially on the overall surface of the p-type contact layer 6 by plasma CVD (chemical vapor deposition), as shown in FIG. 4. A photoresist layer (not shown) is applied onto the $SiO_2$ film 13, for thereafter forming a striped (elongated) resist pattern 14 having a width of about 1.5 μm by photolithography.

Figure 5:
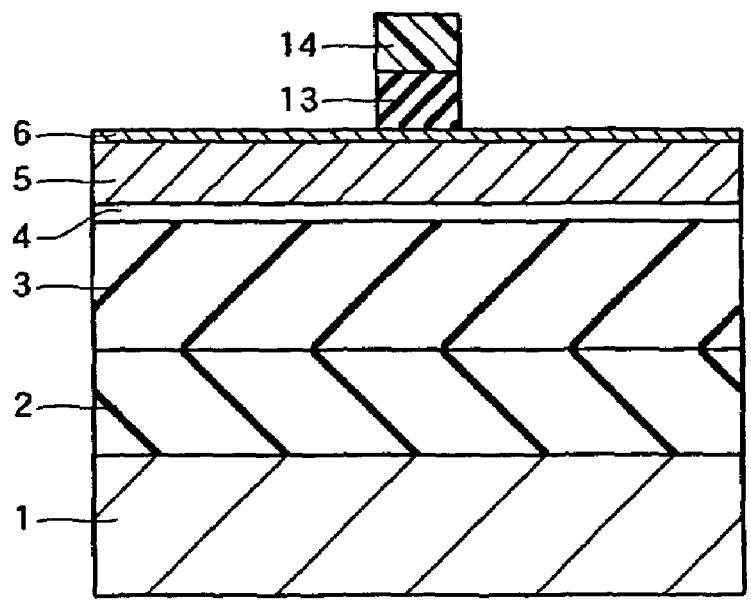

Then, the $SiO_2$ film 13 is etched by RIE (reactive ion etching) with $CF_4$ gas through the resist pattern 14 serving as a mask. Thus, the $SiO_2$ film 13 is worked in a striped manner with a width of about 1.5 μm, as shown in FIG. 5. Thereafter the resist pattern 14 is removed.

Figure 6:
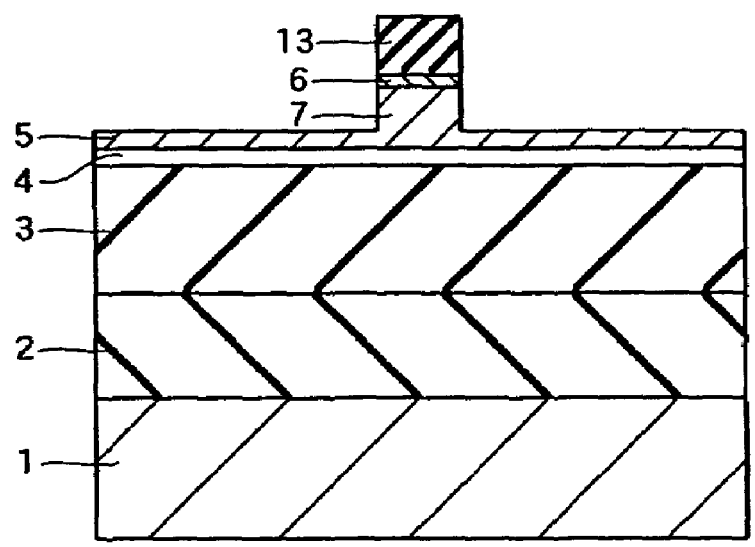

Then, the p-type contact layer 6 and the p-type cladding layer 5 are partially removed by RIE with $Cl_2$ gas through the $SiO_2$ film 13 serving as a mask thereby forming the ridge portion 7, as shown in FIG. 6. At this time, the etching depth is so controlled as to set the thickness of the region of the p-type cladding layer 5 excluding the projecting portion to about 0.05 μm. Thereafter the $SiO_2$ film 13 is removed with an HF-based etchant.

Figure 7:
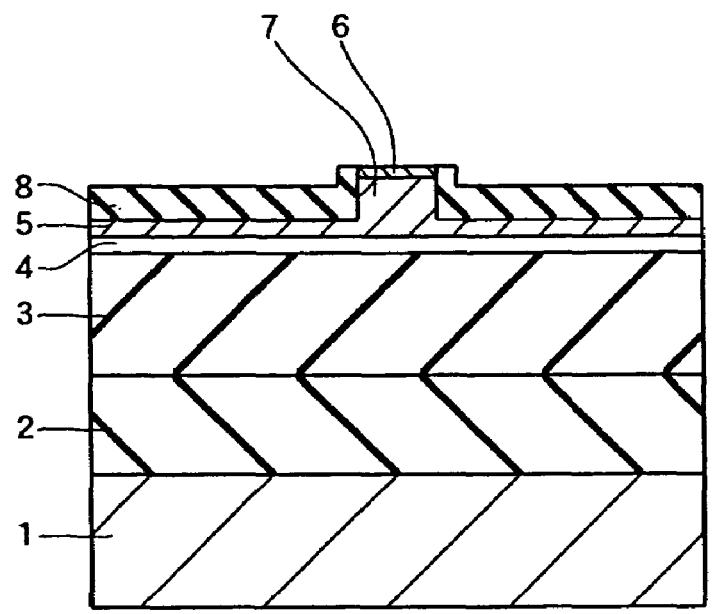

Then, another $SiO_2$ film (not shown) having a thickness of about 0.2 μm is formed to cover the surfaces of the p-type cladding layer 5 and the p-type contact layer 6 by plasma CVD, and thereafter partially removed to expose the upper surface of the p-type contact layer 6 by photolithography and RIE with $CF_4$ gas thereby forming the current blocking layer 8 consisting of the $SiO_2$ film, as shown in FIG. 7.

Figure 8:
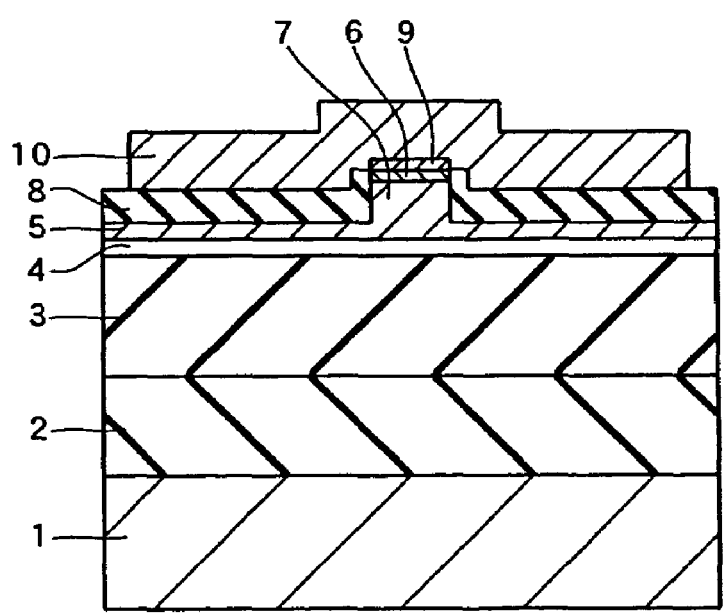

Then, the p-side ohmic electrode 9 consisting of the Pt layer having the thickness of about 1 nm, the Pd layer having the thickness of about 100 nm, the Au layer having the thickness of about 240 nm and the Ni layer having the thickness of about 240 nm in ascending order is formed on the p-type contact layer 6 in a striped manner by vacuum deposition, as shown in FIG. 8. Then, the p-side pad electrode 10 consisting of the Ti layer having the thickness of about 100 nm, the Pt layer having the thickness of about 150 nm and the Au layer having the thickness of about 3 μm in ascending order is formed on the surface of the p-side ohmic electrode 9 and the partial region of the surface of the current blocking layer 8 by vacuum deposition.

Finally, the rear surface of the n-type GaN substrate 1 is polished thereby setting the n-type GaN substrate 1 to a prescribed thickness of about 100 μm, for example, as shown in FIG. 1. Thereafter the n-side ohmic electrode 11 consisting of the Al layer having the thickness of about 6 nm, the Si layer having the thickness of about 2 nm, the Ni layer having the thickness of about 10 nm and the Au layer having the thickness of about 100 nm from the side closer to the n-type GaN substrate 1 is formed on the rear surface of the n-type GaN substrate 1 by vacuum deposition. Then, the n-side pad electrode 12 consisting of the Ni layer having the thickness of about 10 nm and the Au layer having the thickness of about 700 nm from the side closer to the n-side ohmic electrode 11 is formed on the rear surface of the n-side ohmic electrode 11 by vacuum deposition. Thus, the nitride-based semiconductor laser device according to the first embodiment is formed.

Second Embodiment

Figure 9:
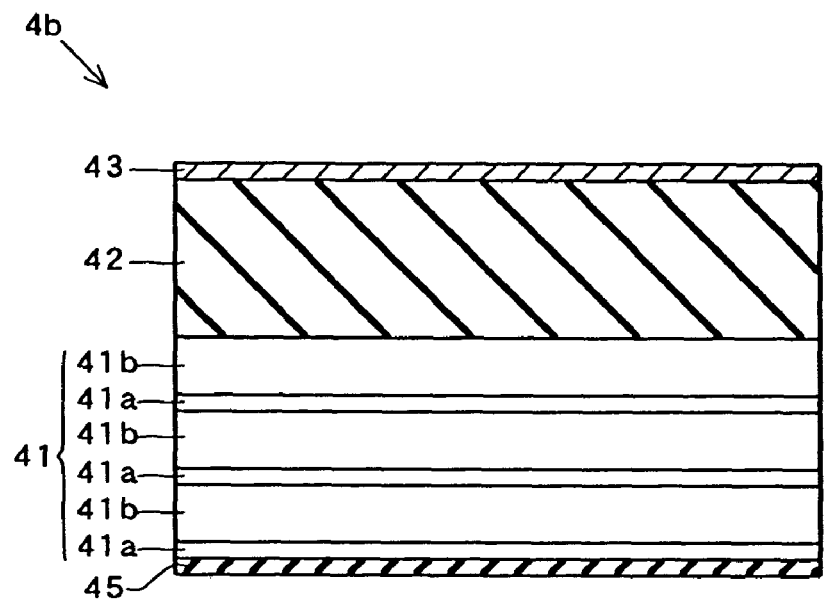
FIG. 9 is a detailed sectional view of an emission layer of a nitride-based semiconductor laser device according to a second embodiment of the present invention.

A nitride-based semiconductor laser device according to a second embodiment of the present invention is now described with reference to FIG. 9. Referring to FIG. 9, an n-type carrier blocking layer 45 is provided on the lower surface (closer to a substrate) of an MQW active layer 41 of an emission layer 4b in a structure similar to that of the aforementioned first embodiment. The remaining structure of the second embodiment is similar to that of the first embodiment.

In the nitride-based semiconductor laser device according to the second embodiment, the MQW active layer 41, a p-side light guide layer 42 and a p-type carrier blocking layer 43 similar in thickness and composition to those in the first embodiment are successively formed on the n-type carrier blocking layer 45 of undoped $Al_{0.25}Ga_{0.75}N$ having a thickness of about 20 nm, as shown in FIG. 9. The n-type carrier blocking layer 45 has a refractive index smaller than those of an undoped n-type cladding layer 3 and the MQW active layer 41. In other words, the relation between the refractive indices of the n-type carrier blocking layer 45, the n-type cladding layer 3 and the MQW active layer 41 is as follows:

n-type carrier blocking layer 45 <n-type cladding layer 3< MQW active layer 41

The n-type carrier blocking layer 45 has a band gap larger than those of the undoped n-type cladding layer 3 and the MQW active layer 41. The aforementioned nitride-based semiconductor layers 41 to 43 and 45 constitute the emission layer 4b according to the second embodiment.

According to the second embodiment, as hereinabove described, the n-type carrier blocking layer 45 having the refractive index smaller than that of the undoped n-type cladding layer 3 is so provided between the undoped n-type cladding layer 3 and the MQW active layer 41 as to confine light in the n-type cladding layer 3 having the refractive index larger than that of the n-type carrier blocking layer 45, whereby the light can easily effuse into the n-type cladding layer 3. If no n-type carrier blocking layer 45 is provided, the MQW active layer 41 having a refractive index larger than that of the n-type cladding layer 3 so strongly confines light that the light only slightly effuses into the n-type cladding layer 3. Thus, the light generated in the MQW active layer 41 can more preferentially effuse toward the n-type GaN substrate 1 as compared with the first embodiment. If having a larger thickness (e.g., the order of microns), however, the n-type carrier blocking layer 45 acts as a cladding layer having a small refractive index. In this case, the MQW active layer 41 so strongly confines light that it is difficult to attain the aforementioned effect. Therefore, the n-type carrier blocking layer 45 is preferably formed with a small thickness.

According to the second embodiment, further, the n-type carrier blocking layer 45 having the band gap larger than those of the n-type cladding layer 3 and the MQW active layer 41 is provided between the n-type cladding layer 3 and the MQW active layer 41 as hereinabove described. In this structure, holes can be further inhibited from overflowing into the n-type cladding layer 3 due to the difference between the band gaps of the n-type carrier blocking layer 45 and the MQW active layer 41 larger than that between the band gaps of the n-type cladding layer 3 and the MQW active layer 41.

The remaining effects of the second embodiment are similar to those of the first embodiment.

Third Embodiment

Figure 10:
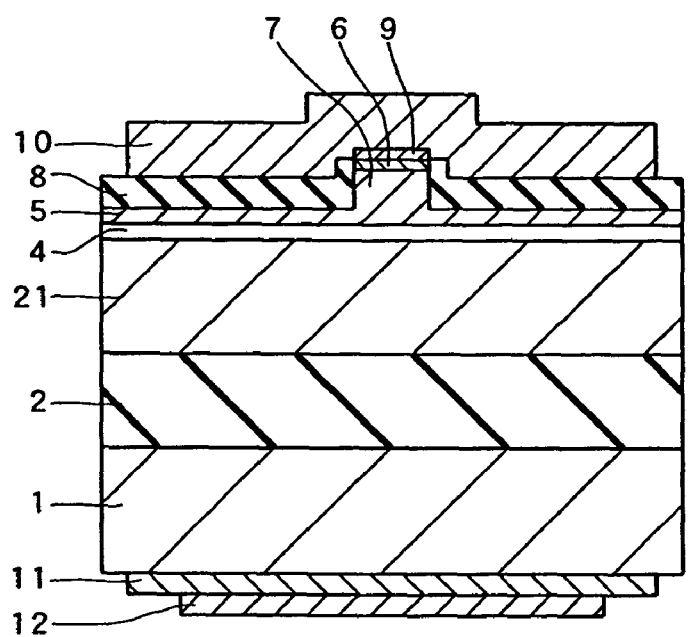
FIG. 10 is a detailed sectional view of an emission layer of a nitride-based semiconductor laser device according to a third embodiment of the present invention.

In a nitride-based semiconductor laser device according to a third embodiment of the present invention, an n-type cladding layer 21 doped with Ge is formed on an n-type GaN substrate 1 as shown in FIG. 10, dissimilarly to the aforementioned first and second embodiments. The remaining structure of the third embodiment is similar to that of the first embodiment.

In the nitride-based semiconductor laser device according to the third embodiment, an undoped GaN layer 2 similar in thickness and composition to that in the first embodiment is formed on the (0001) plane of the n-type GaN substrate 1 doped with oxygen, as shown in FIG. 10.

According to the third embodiment, the n-type cladding layer 21 of n-type $Al_{0.07}Ga_{0.93}N$ doped with Ge having a thickness of about 1 µm and a carrier concentration of about $1\times10^{18}$ $cm^{-3}$ is formed on the undoped GaN layer 2. Ge doped into the n-type cladding layer 21 has a lattice constant larger than that of Si and close to that of a nitride-based semiconductor.

An emission layer 4, a p-type cladding layer 5 and a p-type contact layer 6 similar in thickness and composition to those in the first embodiment are formed on the n-type cladding layer 21. A current blocking layer 8 consisting of an $SiO_2$ film is formed on the side surfaces of a ridge portion 7 and an exposed surface of the p-type cladding layer 5. A p-side ohmic electrode 9 and a p-side pad electrode 10 as well as an n-side ohmic electrode 11 and an n-side pad electrode 12 similar in thickness and composition to those in the first embodiment are formed on the n- and p-sides of the device respectively.

According to the third embodiment, as hereinabove described, the n-type cladding layer 21 is doped with Ge having the lattice constant close to that of the nitride-based semiconductor so that distortion resulting from doping can be effectively suppressed as compared with a case of doping the n-type cladding layer 21 with Si generally employed as an n-type dopant. Therefore, the n-type cladding layer 21 as well as an MQW active layer 41 formed thereon can be improved in crystal quality. Thus, the n-type cladding layer 21 can be inhibited from optical absorption, and the MQW active layer 41 can be improved in luminous efficiency. Further, the resistance value of the n-type cladding layer 21 can be easily controlled by an amount of Ge in doping.

The remaining effects of the third embodiment are similar to those of the first embodiment.

Fourth Embodiment

Figure 11:
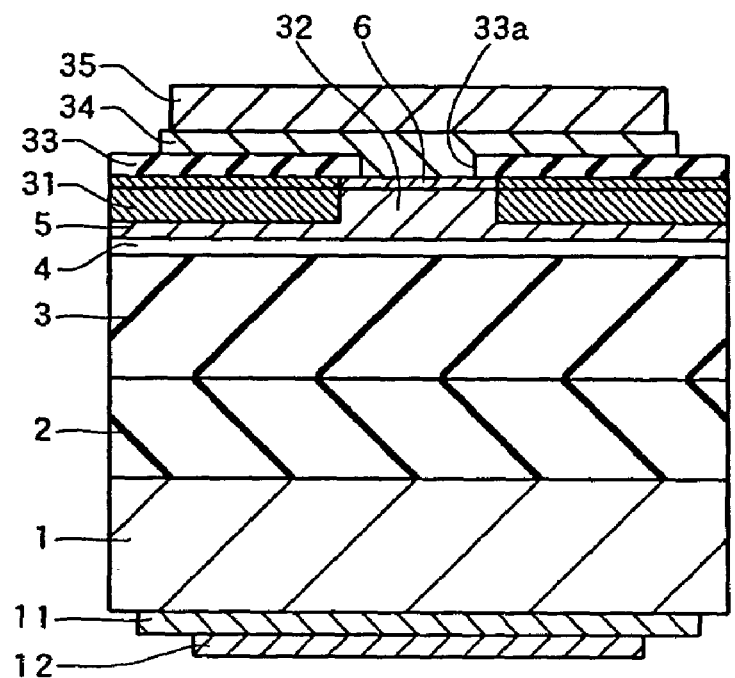
FIG. 11 is a sectional view of a nitride-based semiconductor laser device according to a fourth embodiment of the present invention.

Referring to FIG. 11, the current path in a nitride-based semiconductor laser device according to a fourth embodiment of the present invention is narrowed with an ion implantation layer 31 dissimilarly to those according to the first to third embodiments being narrowed with the ridge portions 7 and the current blocking layers 8.

In the nitride-based semiconductor laser device according to the fourth embodiment, an undoped GaN layer 2, an n-type cladding layer 3, an emission layer 4, a p-type cladding layer 5 and a p-type contact layer 6 similar in thickness and composition to those in the first embodiment are successively formed on the (0001) plane of an n-type GaN substrate 1 doped with oxygen, as shown in FIG. 11.

The p-type cladding layer 5 and the p-type contact layer 6 are provided with an ion implantation layer 31 having an implantation depth of about 0.32 µm formed by ion-implanting carbon (C). The peak depth of the concentration of the ion-implanted carbon is positioned in a region of the p-type cladding layer 5 of about 0.23 µm from the upper surface of the p-type contact layer 6. The peak concentration at the peak depth is about $1\times10^{20}$ $cm^{-3}$. A region (non-implantation region), subjected to no ion implantation, defining a current path part 32 has a width of about 2.1 µm. The ion implantation layer 31 contains a larger number of crystal defects than the remaining regions due to a large quantity of ions implanted into the semiconductor. Thus, the ion implantation layer 31 exhibiting high resistance due to the large number of crystal defects acts as a current narrowing layer and also as an optical absorption layer due to optical absorption resulting from the crystal defects. Carbon (C) is an example of the "impurity" in the present invention, and the ion implantation layer 31 is an example of the "impurity introduction layer" in the present invention.

An insulator film 33 of $ZrO_2$ having an opening 33a is formed on the upper surface of the p-type contact layer 6. This opening 33a is formed to have a smaller width than the current path part 32. A p-side ohmic electrode 34 is formed on the upper surface of the insulator film 33 to come into contact with the upper surface of the p-type contact layer 6 through the opening 33a of the insulator film 33 while extending on the upper surface of the insulator film 33. The p-side ohmic electrode 34 consists of a Pt layer having a thickness of about 1 nm, a Pd layer having a thickness of about 100 nm, an Au layer having a thickness of about 240 nm and an Ni layer having a thickness of about 240 nm in ascending order. A p-side pad electrode 35 consisting of a Ti layer having a thickness of about 100 nm, a Pt layer having a thickness of about 150 nm and an Au layer having a thickness of about 3 μm in ascending order is formed on the upper surface of the p-side ohmic electrode 34. An n-side ohmic electrode 11 and an n-side pad electrode 12 similar in thickness and composition to those in the first embodiment are formed on the rear surface of the n-type GaN substrate 1 successively from that closer to the n-type GaN substrate 1.

The nitride-based semiconductor laser device according to the fourth embodiment, capable of transversely confining light due to the function of the ion implantation layer 31 serving as an optical absorption layer as hereinabove described, can stabilize the transverse mode of its laser beam. Further, the nitride-based semiconductor laser device can also stabilize the laser beam due to light generated in the emission layer 4 and preferentially effusing toward the n-type GaN substrate 1 and the impurity level of the n-type GaN substrate 1 absorbing the light effusing toward the n-type GaN substrate 1. Consequently, the nitride-based semiconductor laser device can further stabilize the laser beam due to synergism of the aforementioned two effects.

The remaining effects of the fourth embodiment are similar to those of the first embodiment.

A process of fabricating the nitride-based semiconductor laser device according to the fourth embodiment is now described with reference to FIGS. 11 to 15.

Figure 12:
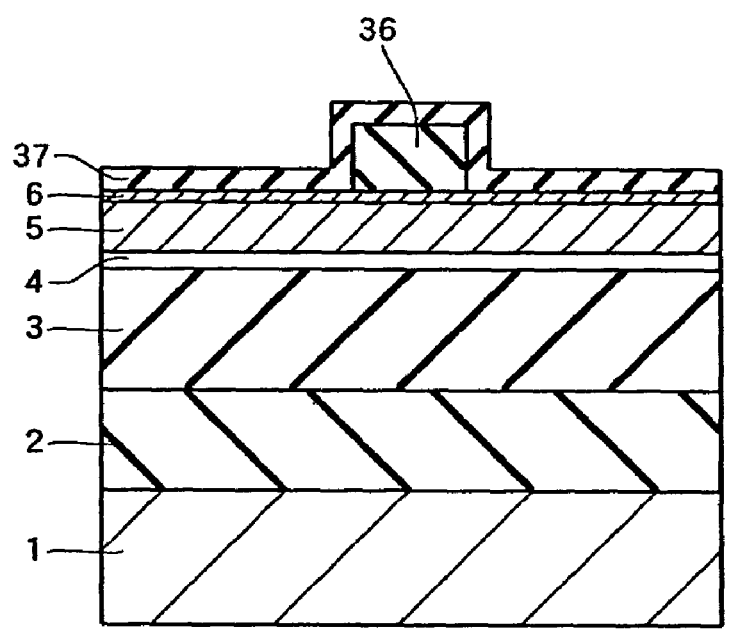
FIGS. 12 to 15 are sectional views for illustrating a process of fabricating the nitride-base semiconductor laser device according to the fourth embodiment shown in FIG. 11.

As shown in FIG. 12, the layers from the undoped GaN layer 2 to the p-type contact layer 6 are successively formed on the (0001) plane of the n-type GaN substrate 1 doped with oxygen through a fabrication process similar to that in the first embodiment. Then, an $SiO_2$ film (not shown) having a thickness of about 1 μm is formed on the overall surface of the p-type contact layer 6 by plasma CVD and thereafter patterned by photolithography and etching, thereby forming a striped (elongated) ion implantation mask layer 36 of $SiO_2$ having a thickness of about 2.2 μm. A through film 37 of $SiO_2$ is to cover the surfaces of the ion implantation mask layer 36 and the p-type contact layer 6.

Figure 13:
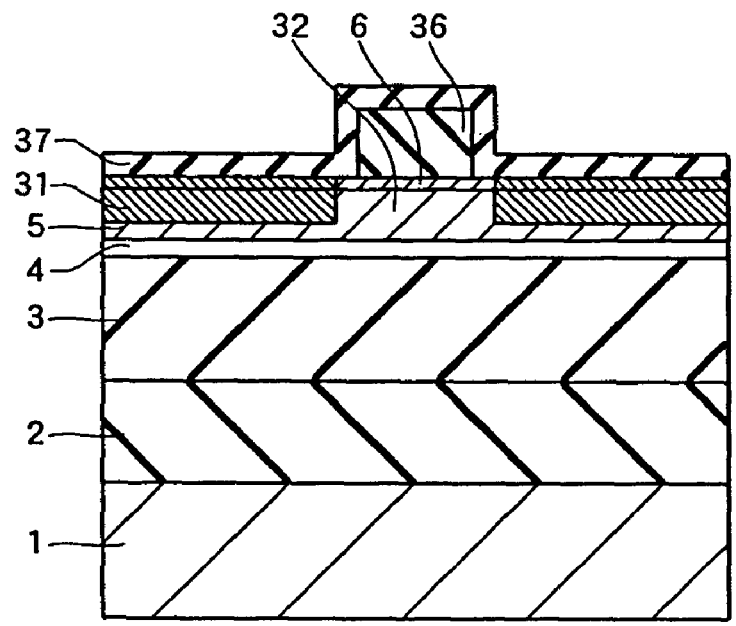

As shown in FIG. 13, the ion implantation mask layer 36 is employed as a mask for ion-implanting carbon through the through film 37, thereby forming the ion implantation layer 31 having the injection depth of about 0.32 μm through the p-type cladding layer 5 and the p-type contact layer 6. Thus, the ion implantation layer 31 serves as a current narrowing layer with formation of the current path part 32 having the width of about 2.1 μm. The injection depth (the thickness) of the ion implantation layer 31 is defined as Rp+ΔRp, where Rp represents the peak depth and ΔRp represents standard deviation of the range. The implanted ions transversely spread (ΔR1) on the lower portion of the ion implantation mask layer 36. Assuming that W represents the width of the ion implantation mask layer 36, the width B of a lower region of the ion implantation mask 36 subjected to no ion implantation is expressed as follows:

$$B=W-2\times\Delta R1$$

In order to not only narrow the current but also sufficiently transversely confine light by the ion implantation layer 31, the maximum value of the impurity concentration of the ion-implanted carbon is preferably at least about $5\times10^{19}$ $cm^{-3}$. Thus, the ion implantation layer 31 contains a larger number of crystal defects than the current path part 32, so that the crystal defects can absorb light. Thereafter the through film 37 is removed by dry etching with $CF_4$ gas.

Figure 14:
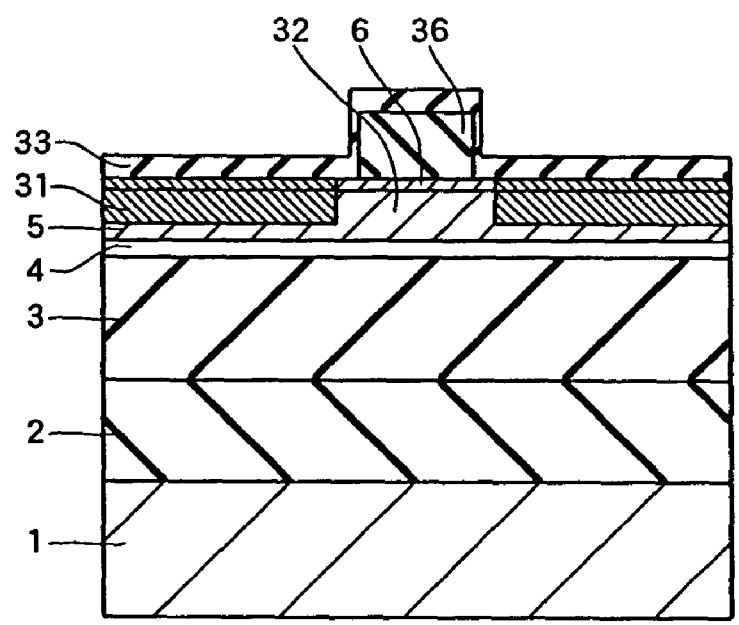

As shown in FIG. 14, the insulator film 33 of $ZrO_2$ having the thickness of about 50 nm is perpendicularly deposited by electron beam deposition to cover the surfaces of the p-type contact layer 6 and the ion implantation mask layer 36. Thus, the insulator film 33 is hardly formed on the sidewalls of the ion implantation mask layer 36.

Figure 15:
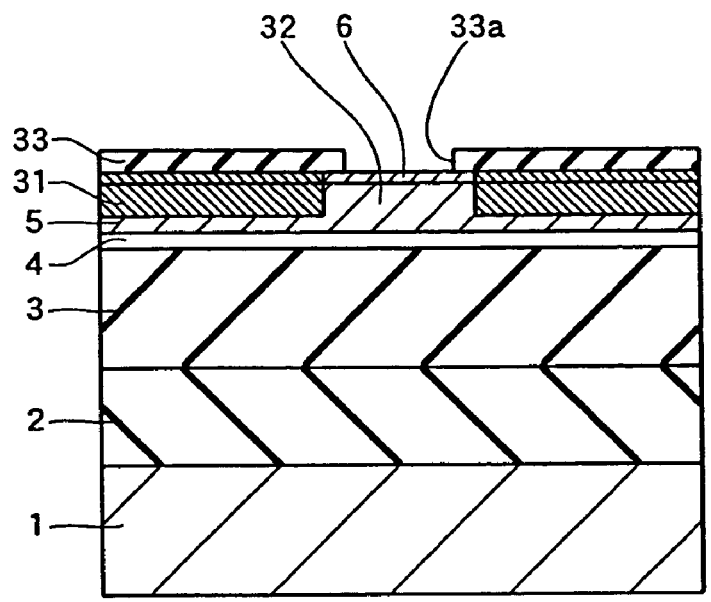

As shown in FIG. 15, the ion implantation mask layer 36 and a partial region of the insulator film 33 are removed by etching with a hydrofluoric acid-based etchant. In this case, the insulator film 33 is so hardly etched that only portions located on the side walls of the ion implantation mask layer 36 are completely removed. The ion implantation mask layer 36 is completely removed after removal of the portions of the ion implantation mask layer 36 located on the side walls thereof. Consequently, the insulator film 33 of $ZrO_2$ is provided with the opening 33a on the upper surface of the current path part 32.

Finally, the p-side ohmic electrode 34 consisting of the Pt layer having the thickness of about 1 nm, the Pd layer having the thickness of about 100 nm, the Au layer having the thickness of about 240 nm and the Ni layer having the thickness of about 240 nm in ascending order is formed to come into contact with the upper surface of the p-type contact layer 6 through the opening 33a while extending on the upper surface of the insulator film 33, as shown in FIG. 11. The p-side pad electrode 35 consisting of the Ti layer having the thickness of about 100 nm, the Pt layer having the thickness of about 150 nm and the Au layer having the thickness of about 3 μm in ascending order is formed on the p-side ohmic electrode 34. The n-type GaN substrate 1 is polished to a prescribed thickness, for thereafter forming the n-side ohmic electrode 11 and the n-side pad electrode 12 on the rear surface thereof from the side closer to the n-type GaN substrate 1. Thus, the nitride-based semiconductor laser device according to the fourth embodiment is formed.

Fifth Embodiment

Figure 16:
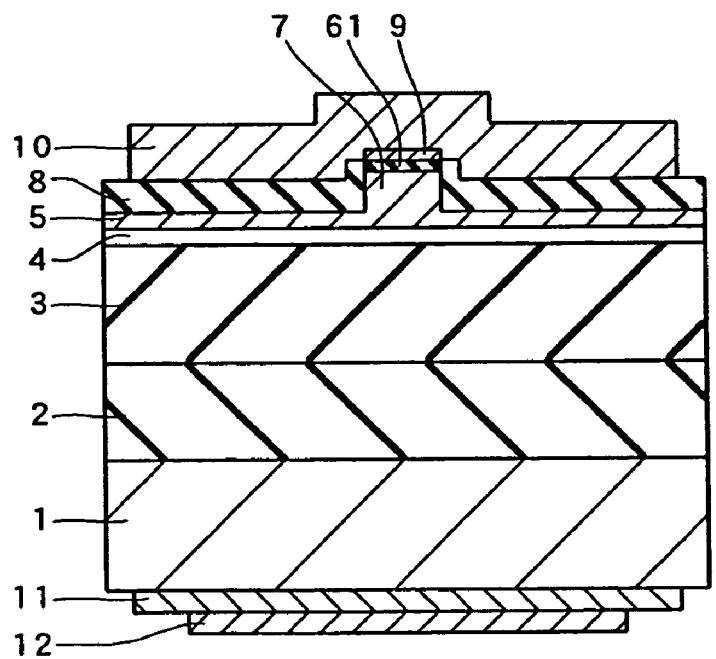
FIG. 16 is a sectional view of a nitride-based semiconductor laser device according to a fifth embodiment of the present invention.

In a nitride-based semiconductor laser device according to a fifth embodiment of the present invention shown in FIG. 16, a p-side contact layer 61 is undoped and has a thickness and an In composition ratio smaller than those of a quantum well layer 41a, dissimilarly to the aforementioned first to fourth embodiments. The remaining structure of the fifth embodiment is similar to that of the first embodiment.

In the nitride-based semiconductor laser device according to the fifth embodiment, an undoped GaN layer 2, an n-type cladding layer 3, an emission layer 4 and a p-type cladding layer 5 similar in thickness and composition to those in the first embodiment are successively formed on the (0001) plane of an n-type GaN substrate 1 doped with oxygen, as shown in FIG. 16.

According to the fifth embodiment, the p-side contact layer 61 of undoped In$_Z$Ga$_{1-Z}$N is formed on a projecting portion of the p-type cladding layer 5 constituting a ridge portion 7. The thickness of the undoped p-side contact layer 61, which is set to about 3 nm, is smaller than the thickness (about 3.5 nm) of the quantum well layer 41a (see FIG. 2). The In composition ratio (Z) of the undoped p-side contact layer 61, which is set to 0.10, is smaller than the In composition ratio (X=0.15) of the quantum well layer 41a consisting of undoped In$_X$Ga$_{1-X}$N.

A threshold current tends to increase if the In composition ratio (Z) of the p-side contact layer 61 consisting of undoped In$_Z$Ga$_{1-Z}$N is excessively increased. Therefore, the In composition ratio (Z) of the undoped p-side contact layer 61 is preferably set so that the difference between the same and the In composition ratio (X) of the quantum well layer 41a consisting of undoped In$_X$Ga$_{1-X}$N is at least about 0.05 (X−Z≧0.05). In other words, the In composition ratio (Z) of the p-side contact layer 61 is preferably set to be smaller by at least about 0.05 than the In composition ratio (X) of the quantum well layer 41a. On the other hand, an operating voltage tends to increase if the In composition ratio (Z) of the p-side contact layer 61 consisting of undoped In$_Z$Ga$_{1-Z}$N is excessively reduced. Therefore, the In composition ratio (Z) of the undoped p-side contact layer 61 is preferably set to be at least about 0.05 (Z≧0.05). Therefore, the In composition ratio (Z) of the p-side contact layer 61 is set under a condition (X−0.0≧Z≧0.05) of at least about 0.05 and smaller by at least about 0.05 than the In composition ratio (X) of the quantum well layer 41a. According to the fifth embodiment, this condition (X−0.05≧Z≧0.05) is satisfied as follows:

$X-0.05=0.15-0.05=0.10$ $Z=0.10$

A threshold current or an operating current tends to increase if the thickness of the p-side contact layer 61 consisting of undoped In$_Z$Ga$_{1-Z}$N is excessively increased. Therefore, the thickness of the undoped p-side contact layer 61 is preferably set to not more than about 5 nm. On the other hand, the operating voltage tends to increase if the thickness of the p-side contact layer 61 consisting of undoped In$_Z$Ga$_{1-Z}$N is excessively reduced. Therefore, the thickness of the undoped p-side contact layer 61 is preferably set to at least about 3 nm. According to the fifth embodiment, the thickness of the undoped p-side contact layer 61 is about 3 nm, to satisfy the aforementioned condition (at least about 3 nm and not more than about 5 nm).

A current blocking layer 8 is formed on the sidewalls of the ridge portion 7 and an exposed surface of the p-type cladding layer 5. A p-side ohmic electrode 9 and a p-side pad electrode 10 as well as an n-side ohmic electrode 11 and an n-side pad electrode 12 similar in thickness and composition to those in the first embodiment are formed on the n- and p-sides of the device respectively.

According to the fifth embodiment, as hereinabove described, the p-side contact layer 61 formed on the projecting portion of the p-type cladding layer 5 constituting the ridge portion 7 is so undoped that the undoped p-side contact layer 61 is formed with no impurity level and can be inhibited from optical absorption resulting from an impurity level, dissimilarly to a p-type contact layer doped with a p-type dopant such as Mg. Further, the thickness and the In composition ratio (Z) of the undoped p-side contact layer 61 are set to about 3 nm and 0.10 smaller than the thickness (about 3.5 nm) and the In composition ratio (X=0.15) of the quantum well layer 41a respectively so that the undoped p-side contact layer 61 has a band gap larger than that of an MQW active layer 41 (quantum level in the quantum well layer 41a), whereby the p-side contact layer 61 can be inhibited from optical absorption. Thus, the threshold current or the operating current can be inhibited from increase resulting from optical absorption in the p-side contact layer 61.

Particularly in the fifth embodiment, the threshold current or the operating voltage can be further inhibited from increase by setting the thickness (about 3 nm) and the In composition ratio (Z=0.10) of the undoped p-side contact layer 61 to satisfy the conditions (the thickness of at least about 3 nm and not more than about 5 nm and the In composition ratio (Z) of at least 0.05 (the In composition ratio (Z) of the quantum well layer 41a—0.05)) for inhibiting the threshold current and the operating current from increase. Further, light generated in the MQW active layer 41 can further preferentially effuse toward the n-type GaN substrate 1 due to suppression of optical absorption in the p-side contact layer 61, whereby the nitride-based semiconductor laser device can further stabilize its laser beam.

The remaining effects of the fifth embodiment are similar to those of the first embodiment.

Sixth Embodiment

Figure 17:
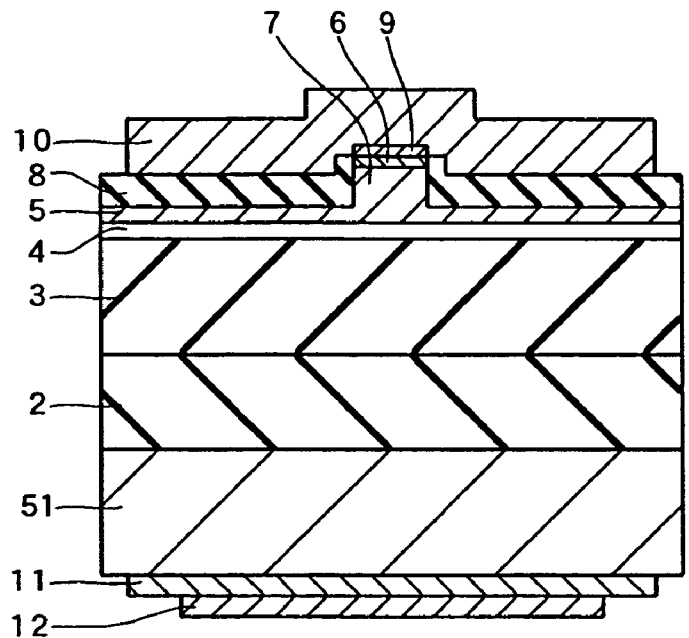
FIG. 17 is a sectional view of a nitride-based semiconductor laser device according to a sixth embodiment of the present invention.
Figure 18:
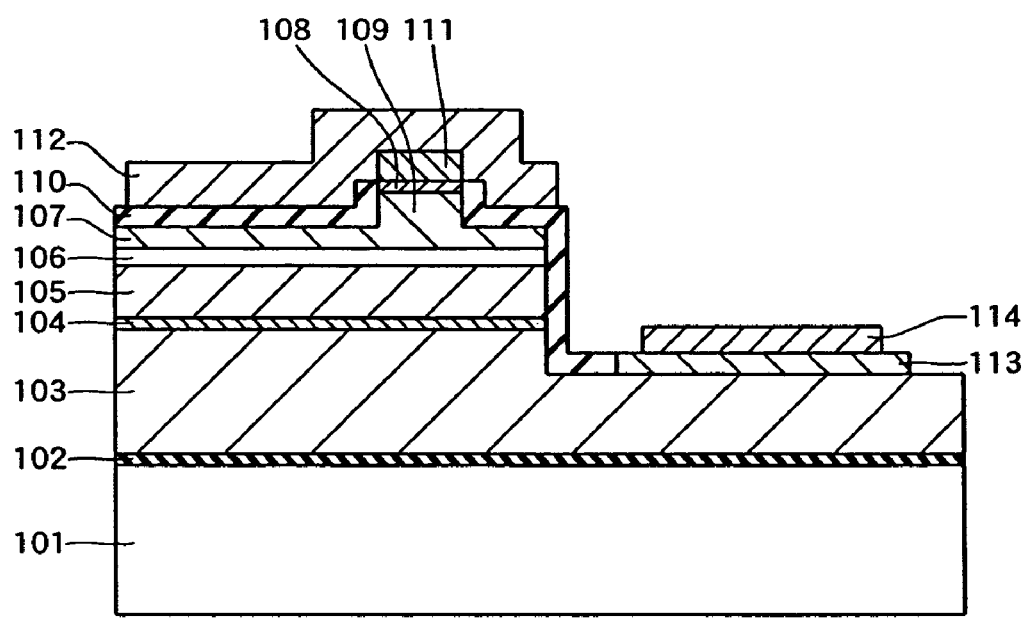
FIG. 18 is a sectional view showing an exemplary conventional nitride-based semiconductor laser device.
Figure 19:
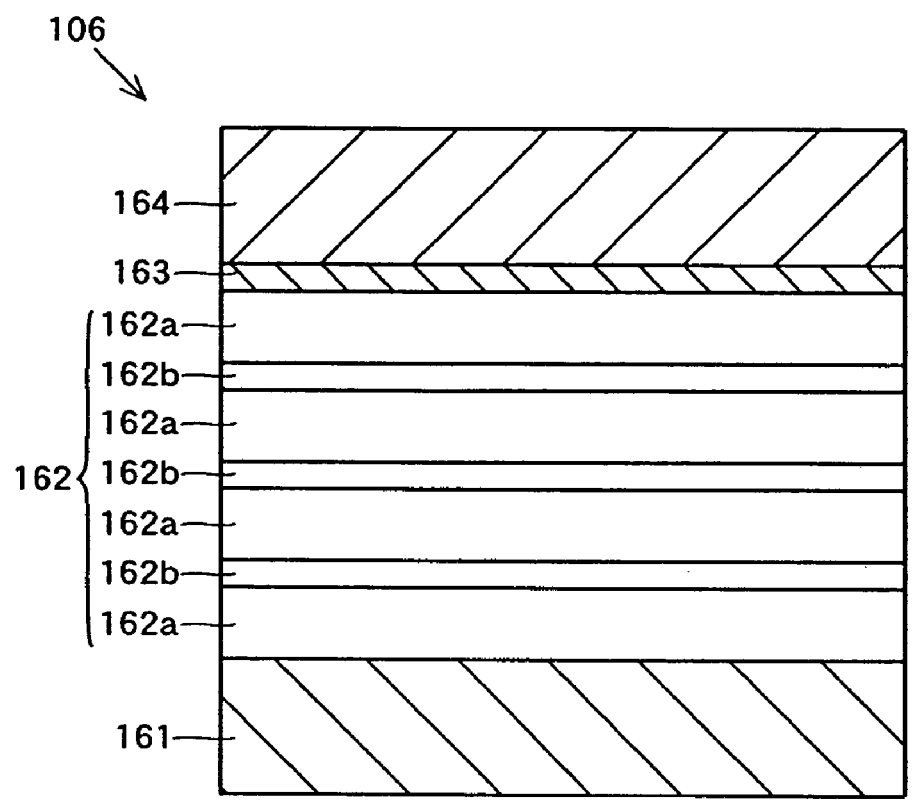
FIG. 19 is a detailed sectional view of an emission layer of the conventional nitride-based semiconductor laser device shown in FIG. 18.

Referring to FIG. 17, a nitride-based semiconductor laser device according to a sixth embodiment of the present invention employs an undoped ZrB$_2$ substrate 51 in place of the n-type GaN substrate 1 employed in each of the aforementioned first to fifth embodiments. The remaining structure of the sixth embodiment is similar to that of the first embodiment.

In the nitride-based semiconductor laser device according to the sixth embodiment, nitride-based semiconductor layers, i.e., an undoped GaN layer 2, an n-type cladding layer 3, an emission layer 4, a p-type cladding layer 5 and a p-type contact layer 6 similar in thickness and composition to those in the first embodiment are successively formed on the (0001) plane of the undoped ZrB$_2$ substrate 51, as shown in FIG. 17. ZrB$_2$ forming the ZrB$_2$ substrate 51 has a lattice constant close to those of the nitride-based semiconductors and a hexagonal crystal structure. The ZrB$_2$ substrate 51 is an example of the "substrate consisting of a boride-based material" in the present invention. A current blocking layer 8 consisting of an SiO$_2$ film is formed on the sidewalls of a ridge portion 7 and an exposed surface of the p-type cladding layer 5. A p-side ohmic electrode 9 and a p-side pad electrode 10 as well as an n-side ohmic electrode 11 and an n-side pad electrode 12 similar in thickness and composition to those in the first embodiment are formed on the n- and p-sides of the device respectively.

According to the sixth embodiment, as hereinabove described, ZrB$_2$ forming the ZrB$_2$ substrate 51 has the lattice constant close to those of the nitride-based semiconductors, whereby the nitride-based semiconductor layers 2 to 6 formed on the ZrB$_2$ substrate 51 can be improved in crystal quality. Further, the nitride-based semiconductor layers 2 to 6 can be easily formed on the ZrB$_2$ substrate 51 by crystal growth due to the hexagonal crystal structure thereof. In addition, the difference between the lattice constants of the ZrB$_2$ substrate 51 and the nitride-based semiconductors is so small that the nitride-based semiconductor layers 2 to 6 may not be formed through a low-temperature buffer layer. Thus, neither scattering nor absorption of light results from a large number of dislocations of a low-temperature buffer layer itself. Further, the ZrB$_2$ substrate 51 prepared from ZrB$_2$ which is a metalloid can be prevented from excess optical absorption dissimilarly to a substrate consisting of a semiconductor such as Si or GaAs having an excessively small band gap with respect to an emission wavelength. In addition, electric resistance of the ZrB$_2$ substrate 51 is so small that a threshold current or an operating current can be further inhibited from increase.

The remaining effects of the sixth embodiment are similar to those of the first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the undoped GaN layer 2 is formed between the substrate 1 or 51 and the n-type cladding layer 3 or 21 in each of the aforementioned first to sixth embodiments, the present invention is not restricted to this but a layer consisting of a nitride-based semiconductor doped with Ge may alternatively be formed between the substrate 1 or 51 and the n-type cladding layer 3 or 21 in place of the undoped GaN layer 2. The lattice constant of Ge employed as the dopant is so close to those of the nitride-based semiconductors that the possibility of distortion resulting from doping can be effectively reduced. Thus, the n-type cladding layer 3 or 21 and the active layer 41 formed on the nitride-based semiconductor layer doped with Ge can be improved in crystal quality, whereby the n-type cladding layer 3 or 21 can be inhibited from optical absorption and the active layer 41 can be improved in luminous efficiency. Further, the resistance value of the layer consisting of the nitride-based semiconductor layer doped with Ge can be easily controlled by an amount of Ge in doping.

While the p-type carrier blocking layer 43 doped with Mg is provided on the p-side in each of the aforementioned first to sixth embodiments, the present invention is not restricted to this but an undoped carrier blocking layer may alternatively be provided on the p-side. According to this structure, the p-side carrier blocking layer as well as a cladding layer and a contact layer formed thereon can be improved in crystal quality. The undoped carrier blocking layer is formed with no impurity level, whereby the p-side carrier blocking layer as well as the cladding layer and the contact layer formed thereon can be inhibited from optical absorption. Thus, light generated in an MQW active layer can further preferentially effuse toward an n-type GaN substrate or a substrate consisting of a boride-based material.

While the nitride-based semiconductor layers 2 to 6 are formed by crystal growth through MOCVD in each of the aforementioned first to sixth embodiments, the present invention is not restricted to this but the nitride-based semiconductor layers 2 to 6 may alternatively be formed by crystal growth through HVPE (hydride vapor phase epitaxy), gas source MBE (molecular beam epitaxy) employing TMAl, TMGa, TMIn, NH$_3$, SiH$_4$, GeH$_4$ or Cp$_2$Mg as source materials or the like.

While the multiple quantum well (MQW) structure is employed for the active layer 41 in each of the aforementioned first to sixth embodiments, the present invention is not restricted to this but a thick single active layer having no quantum effect or an active layer having a single quantum well structure can also attain a similar effect.

While the nitride-based semiconductor laser device according to each of the aforementioned first to sixth embodiments is so structured that the distance between the substrate 1 or 51 and the emission layer 4 or 4b is about 2 μm, the present invention is not restricted to this but the distance between the substrate 1 or 51 and the emission layer 4 or 4b may be within the range of about 0.5 μm to about 4 μm. If the distance between the substrate 1 or 51 and the emission layer 4 or 4b is not more than about 0.5 μm, optical absorption in the substrate 1 or 51 so increases that the threshold current or the operating current tends to increase. If the distance between the substrate 1 or 51 and the emission layer 4 or 4b is in excess of about 4 μm, optical absorption in the substrate 1 or 51 so reduces that stabilization of the laser beam tends to be insufficient.

While the n-type GaN substrate 1 is employed in each of the aforementioned first to fifth embodiments, the present invention is not restricted to this but the nitride-based semiconductor laser device may alternatively employ a substrate consisting of InGaN, AlGaN, AlGaInN or the like. Further alternatively, the nitride-based semiconductor laser device may employ a substrate consisting of GaBN, InGaBN, AlGaBN, AlGaInBN or the like with addition of B (boron). In order to absorb light effusing toward the substrate, the substrate must have a band gap not more than a value equivalent to the band gap of the active layer. If the substrate contains an impurity, the remainder obtained by subtracting the band gap of the impurity level from that of the substrate material must be not more than the value equivalent to the band gap of the active layer.

While the n-type GaN substrate 1 doped with oxygen is employed in each of the aforementioned first to fifth embodiments, the present invention is not restricted to this but the nitride-based semiconductor laser device may alternatively employ a substrate doped with S, Se, Te, P, As or Sb. Also in this case, the impurity level of the substrate doped with the impurity can absorb light effusing toward the substrate. Further alternatively, the nitride-based semiconductor laser device may employ a substrate of undoped InGaN having a band gap smaller than that of the active layer.

While the nitride-based semiconductor layers 2 to 6 are so stacked that the surfaces thereof are along the (0001) plane in each of the aforementioned first to fifth embodiments, the present invention is not restricted to this but the nitride-based semiconductor layers 2 to 6 may alternatively be so stacked that the surfaces thereof are along another orientation. For example, the nitride-based semiconductor layers 2 to 6 may be so stacked that the surfaces thereof are along a (H, K, −H−K, 0) plane such as the (1−100) plane or the (11−20) plane. In this case, no piezoelectric field is generated in the MQW active layer 41, and hence it is possible to suppress reduction of the recombination probability of holes and electrons resulting from inclination of the energy band of the well layer(s) 41a. Consequently, the MQW active layer 41 can be improved in luminous efficiency.

While the thickness and the In composition ratio of the undoped p-side contact layer 61 are set to about 3 nm and 0.10 smaller than the thickness (about 3.5 nm) and the In composition ratio (0.15) of the quantum well layer 41a respectively thereby increasing the band gap of the undoped p-side contact layer 61 beyond that of the MQW active layer 41 in the aforementioned fifth embodiment, the present invention is not restricted to this but the thickness and the In composition ratio of the undoped p-side contact layer 61 may alternatively be set to values other than the above so far as the band gap of the undoped p-side contact layer 61 is larger that of the active layer 41. For example, the thickness of the undoped p-side contact layer 61 may be set to about 3 nm while setting the In composition ratio to 0.15 identically to the In composition ratio of the quantum well layer 41a. In this case, however, the threshold current increases by about 2 mA as compared with that in the fifth embodiment. Therefore, the thickness as well as the In composition ratio of the undoped p-side contact layer 61 are preferably rendered smaller than those of the quantum well layer 41a.

While the In composition ratio (0.10) of the undoped p-side contact layer 61 is set to be smaller by at least about 0.05 than the In composition ratio (0.15) of the quantum well layer 41a in the aforementioned fifth embodiment, the present invention is not restricted to this but the In composition ratio of the undoped p-side contact layer 61 may be smaller by at least about 0.03 than that of the quantum well layer 41a. When the In composition ratio of the undoped p-side contact layer 61 is set to be smaller by at least about 0.05 than that of the quantum well layer 41a, however, it is possible to further inhibit the threshold current from increase.

While the In composition ratio (0.10) of the undoped p-side contact layer 61 is set to be at least about 0.05 in the aforementioned fifth embodiment, the present invention is not restricted to this but the In composition ratio of the undoped p-side contact layer 61 may be at least about 0.03. When the In composition ratio of the undoped p-side contact layer 61 is set to be at least about 0.05, however, it is possible to further inhibit the operating voltage from increase.

While the thickness (about 3 nm) of the undoped p-side contact layer 61 is set to be at least about 3 nm and not more than about 5 nm in the aforementioned fifth embodiment, the present invention is not restricted to this but the upper limit of this thickness may be not more than about 70 nm. Preferably, the thickness may be not more than about 10 nm. The lower limit of the thickness may be at least about 1 nm. When the thickness of the undoped p-side contact layer 61 is set to be at least about 3 nm and not more than about 5 nm, however, the threshold current or the operating voltage can be further inhibited from increase.

While the $ZrB_2$ substrate 51 is employed in the aforementioned sixth embodiment, the present invention is not restricted to this but the nitride-based semiconductor laser device may alternatively employ a substrate consisting of another boride-based material. For example, $TiB_2$ or the like may be employable as the boride-based material other than $ZrB_2$. $TiB_2$ has a hexagonal crystal structure similarly to $ZrB_2$, and hence hexagonal nitride-based semiconductor layers can be easily formed thereon by crystal growth. However, the difference between the lattice constants of the (0001) plane of $ZrB_2$ and GaN is extremely small, and hence it is possible to form nitride-based semiconductor layers having further excellent crystal quality by employing a substrate consisting of $ZrB_2$.

While the undoped $ZrB_2$ substrate 51 is employed in the aforementioned sixth embodiment, the present invention is not restricted to this but another $ZrB_2$ substrate doped with an impurity such as Si or oxygen may alternatively be employed. In this case, the impurity level of the $ZrB_2$ substrate can absorb light effusing toward the substrate. Thus, the laser beam can be further stabilized.

What is claimed is:

1. A nitride-based semiconductor laser device comprising:
   a substrate consisting of either a nitride-based semiconductor doped with an impurity or a boride-based material;
   an n-type cladding layer formed on said substrate;
   an active layer consisting of a nitride-based semiconductor formed on said n-type cladding layer;
   a p-type cladding layer formed on said active layer; and
   a light guide layer formed only between said active layer and said p-type cladding layer, wherein
   said p-type cladding layer includes a p-type cladding layer consisting of a nitride-based semiconductor having a lattice constant smaller than the lattice constant of GaN, and
   said light guide layer is constituted of a nitride-based semiconductor having a lattice constant larger than the lattice constant of GaN.

2. The nitride-based semiconductor laser device according to claim 1, wherein
   said light guide layer consists of InGaN.

3. A nitride-based semiconductor laser device comprising:
   a substrate consisting of either a nitride-based semiconductor doped with an impurity or a boride-based material;
   an n-type cladding layer formed on said substrate;
   an active layer consisting of a nitride-based semiconductor formed on said n-type cladding layer;
   a p-type cladding layer formed on said active layer;
   a light guide layer formed only between said active layer and said p-type cladding layer; and
   an n-type carrier blocking layer, formed between said n-type cladding layer and said active layer, consisting of a nitride-based semiconductor having a refractive index smaller than the refractive index of said n-type cladding layer.

4. The nitride-based semiconductor laser device according to claim 3, wherein
   said n-type cladding layer includes an n-type cladding layer consisting of AlGaN having a first Al composition ratio, and
   said n-type carrier blocking layer includes an n-type carrier blocking layer consisting of AlGaN having a second Al composition ratio larger than said first Al composition ratio.

5. A nitride-based semiconductor laser device comprising:
   a substrate consisting of either a nitride-based semiconductor doped with an impurity or a boride-based material;
   an n-type cladding layer formed on said substrate;
   an active layer consisting of a nitride-based semiconductor formed on said n-type cladding layer;
   a p-type cladding layer formed on said active layer;
   a light guide layer formed only between said active layer and said p-type cladding layer; and
   an n-type carrier blocking layer, formed between said n-type cladding layer and said active layer, consisting of a nitride-based semiconductor having a band gap larger than the band gap of said n-type cladding layer and the band gap of said active layer.

6. The nitride-based semiconductor laser device according to claim 5, wherein
   said n-type cladding layer includes an n-type cladding layer consisting of AlGaN having a first Al composition ratio while said active layer includes an active layer consisting of InGaN, and
   said n-type carrier blocking layer includes an n-type carrier blocking layer consisting of AlGaN having a second Al composition ratio larger than said first Al composition ratio.

7. A nitride-based semiconductor laser device comprising:

a substrate consisting of either a nitride-based semiconductor doped with an impurity or a boride-based material;

an n-type cladding layer formed on said substrate;

an active layer consisting of a nitride-based semiconductor formed on said n-type cladding layer;

a p-type cladding layer formed on said active layer;

a light guide layer formed only between said active layer and said p-type cladding layer; and an impurity introduction layer formed on a region of said p-type cladding layer other than on a current path part of said p-type cladding layer, wherein said impurity introduction layer is an ion implantation layer.

8. A nitride-based semiconductor laser device comprising:

a substrate consisting of either a nitride-based semiconductor doped with an impurity or a boride-based material;

an n-type cladding layer formed on said substrate;

an active layer consisting of a nitride-based semiconductor formed on said n-type cladding layer;

a p-type cladding layer formed on said active layer;

a light guide layer formed only between said active layer and said p-type cladding layer; and an impurity introduction layer formed on a region of said p-type cladding layer other than on a current path part of said p-type cladding layer, wherein a distance between the emission layer including the active layer and the substrate is within the range of about 0.5 μm to about 4 μm, said impurity includes carbon, and the maximum value of the impurity concentration of carbon in said impurity introduction layer is about $5 \times 10^{19}$ cm$^{-3}$ or greater.

9. A nitride-based semiconductor laser device comprising:

a substrate consisting of either a nitride-based semiconductor doped with an impurity or a boride-based material;

an n-type cladding layer formed on said substrate;

an active layer consisting of a nitride-based semiconductor formed on said n-type cladding layer;

a p-type cladding layer formed on said active layer;

a light guide layer formed only between said active layer and said p-type cladding layer; and an undoped p-side contact layer formed on said p-type cladding layer, wherein said active layer includes an active layer of a quantum well structure consisting of a nitride-based semiconductor containing In, and said undoped p-side contact layer has a thickness smaller than the thickness of a quantum well layer of said active layer and an In composition ratio smaller than the In composition ratio of said quantum well layer.

10. The nitride-based semiconductor laser device according to claim 9, wherein the thickness of said undoped p-side contact layer is about 3 nm and not more than 5 nm.

11. The nitride-based semiconductor laser device according to claim 9, wherein the difference between the In composition ratio of said undoped p-side contact layer and the In composition ratio of said quantum well layer of said active layer is 0.05 or greater.

* * * * *